(12) United States Patent
Dhaoui et al.

(10) Patent No.: US 7,473,960 B1
(45) Date of Patent: *Jan. 6, 2009

(54) NON-VOLATILE TWO-TRANSISTOR PROGRAMMABLE LOGIC CELL AND ARRAY LAYOUT

(75) Inventors: Fethi Dhaoui, Patterson, CA (US); John McCollum, Saratoga, CA (US); Vidyadhara Bellippady, San Jose, CA (US); William C. Plants, Campbell, CA (US); Zhigang Wang, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/927,265

(22) Filed: Oct. 29, 2007

Related U.S. Application Data

(60) Division of application No. 11/303,865, filed on Dec. 16, 2005, which is a continuation-in-part of application No. 11/155,005, filed on Jun. 15, 2005, now Pat. No. 7,285,818.

(51) Int. Cl.
*H01L 29/788* (2006.01)

(52) U.S. Cl. .................. 257/316; 257/317; 257/321

(58) Field of Classification Search ......... 257/314–317, 257/319–321
See application file for complete search history.

(56) References Cited

U.S. PATENT DOCUMENTS

| | | | |
|---|---|---|---|
| 5,510,730 A | 4/1996 | El Gamal et al. | |
| 5,587,603 A | 12/1996 | Kowshik | |
| 5,625,211 A | 4/1997 | Kowshik | |
| 5,640,344 A | 6/1997 | Pani et al. | |
| 5,740,106 A | 4/1998 | Nazarian | |
| 5,847,993 A | 12/1998 | Dejenfelt | |
| 6,144,580 A | 11/2000 | Murray | |
| 6,252,273 B1 | 6/2001 | Salter, III et al. | |
| 6,356,478 B1 | 3/2002 | McCollum | |
| 7,285,818 B2 | 10/2007 | Dhaoui et al. | |
| 2004/0114436 A1 | 6/2004 | Hecht et al. | |
| 2004/0233736 A1 | 11/2004 | Auricchio et al. | |

FOREIGN PATENT DOCUMENTS

JP          2000-12809         *     1/2000

OTHER PUBLICATIONS

Co-pending U.S. Appl. No. 11/927,237, filed Oct. 29, 2007 entitled Non-Volatile Two-Transistor Programmable Logic Cell and Array Layout.
Co-pending U.S. Appl. No. 11/927,282, filed Oct. 29, 2007 entitled Non-Volatile Two-Transistor Programmable Logic Cell and Array Layout.

* cited by examiner

*Primary Examiner*—Thien F Tran
(74) *Attorney, Agent, or Firm*—Lewis and Roca LLP

(57) ABSTRACT

A two-transistor non-volatile memory cell is formed in a semiconductor body. A memory-transistor well is disposed within the semiconductor body. A switch-transistor well is disposed within the semiconductor body and is electrically isolated from the memory transistor well. A memory transistor including spaced-apart source and drain regions is formed within the memory-transistor well. A switch transistor including spaced-apart source and drain regions is formed within the switch-transistor well region. A floating gate is insulated from and self aligned with the source and drain regions of the memory transistor and switch transistor. A control gate is disposed above and aligned to the floating gate and with the source and drain regions of the memory transistor and the switch transistor.

15 Claims, 9 Drawing Sheets

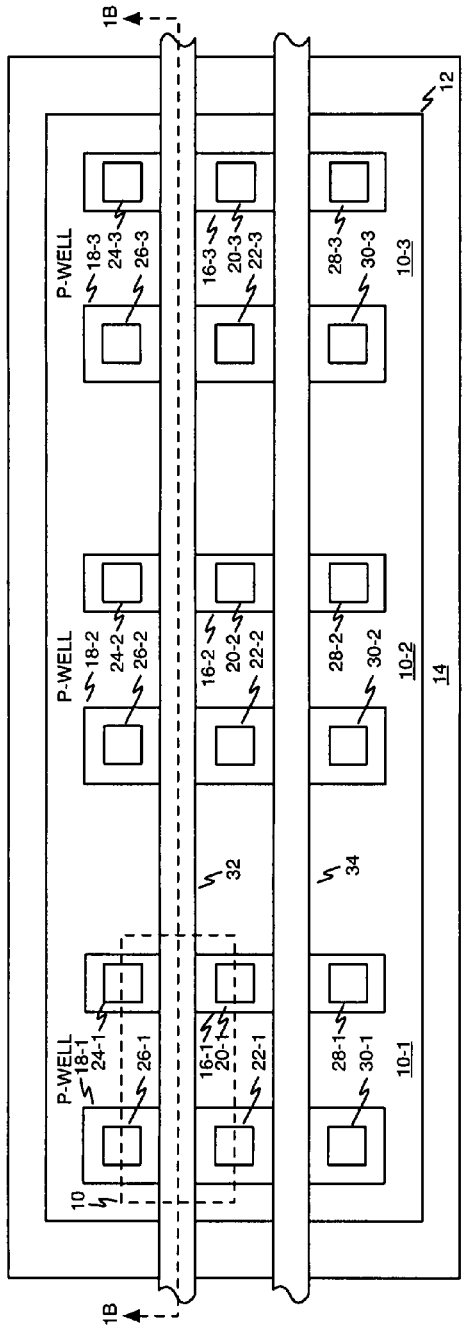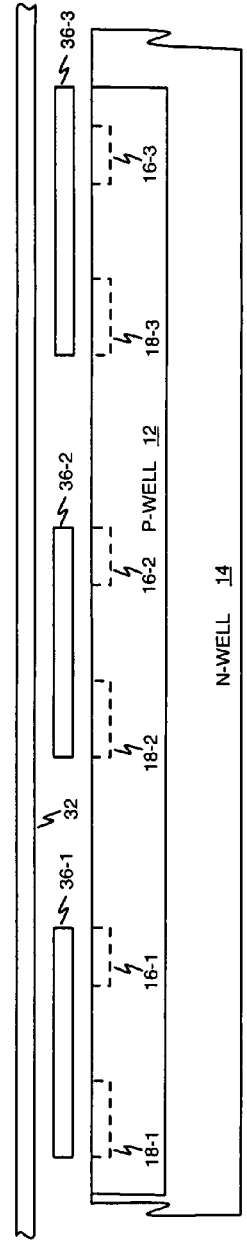
FIGURE 1A
(PRIOR ART)
FIGURE 1B
(PRIOR ART)

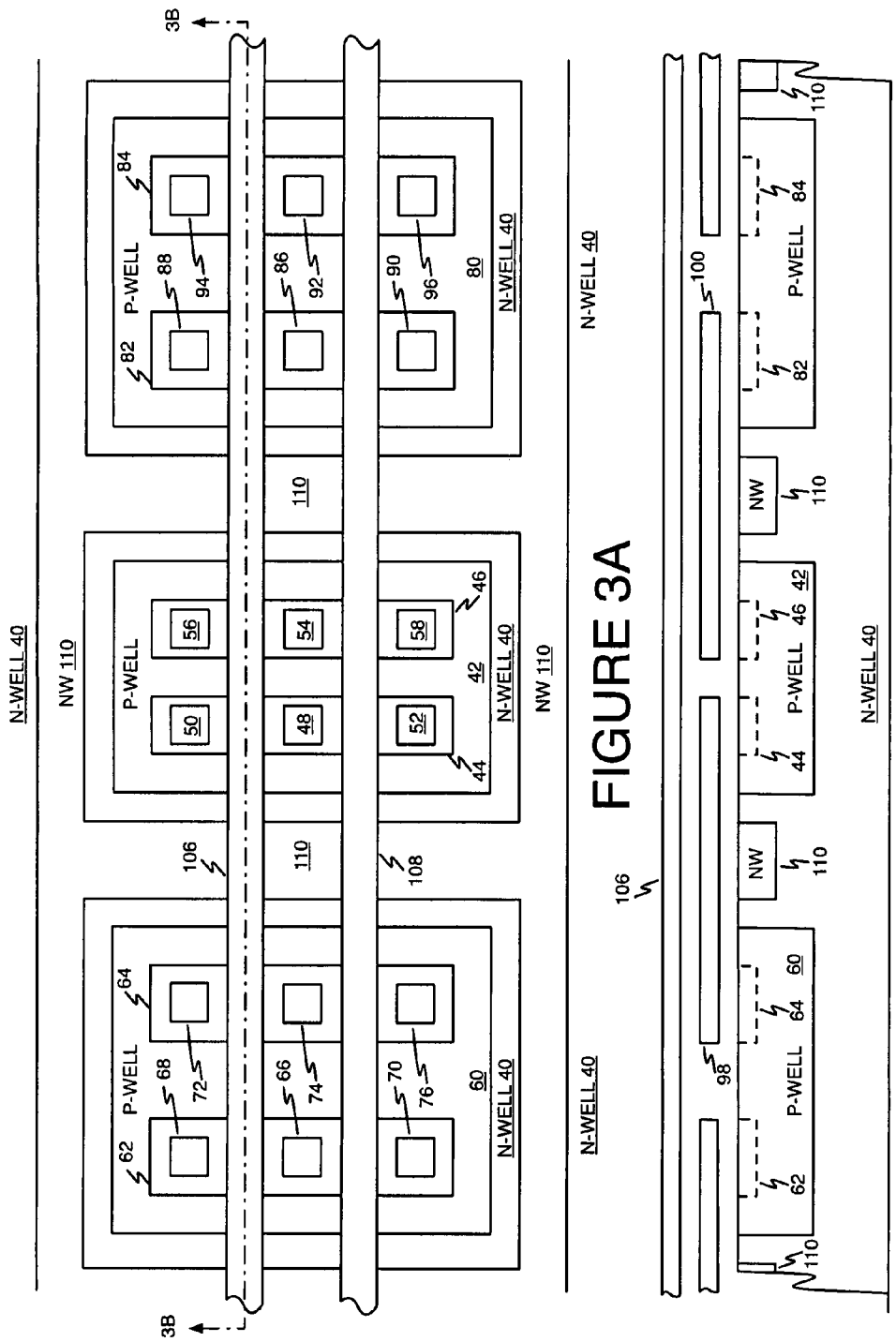

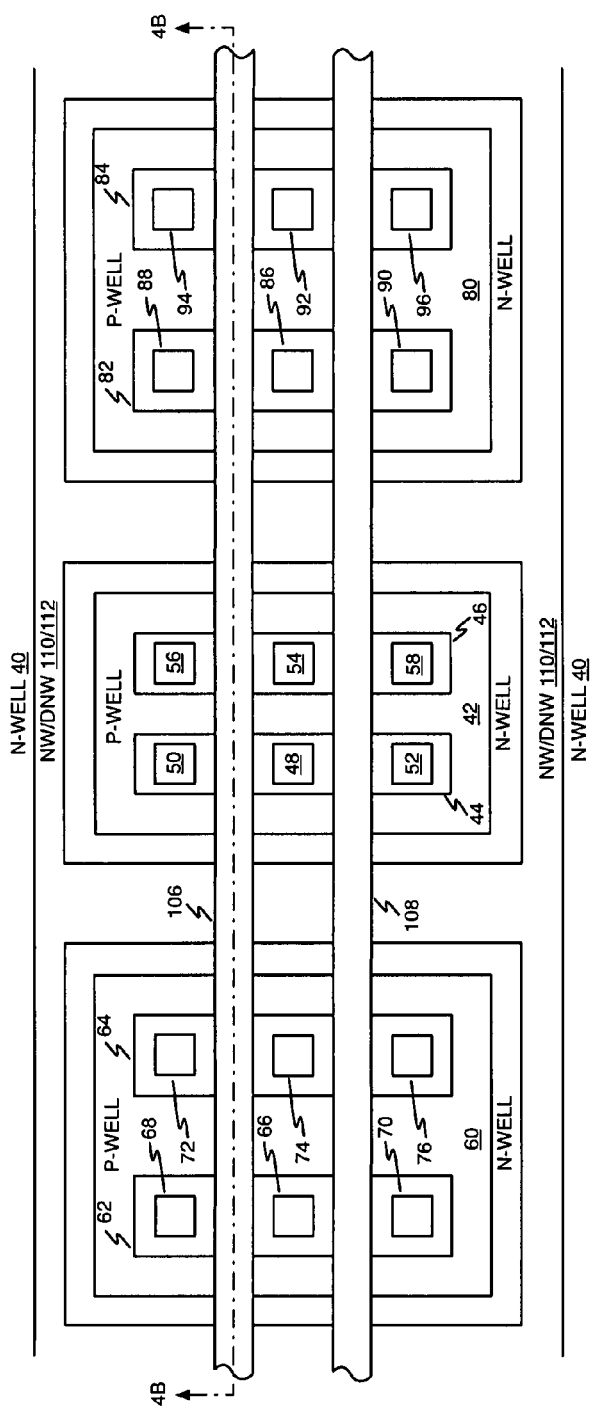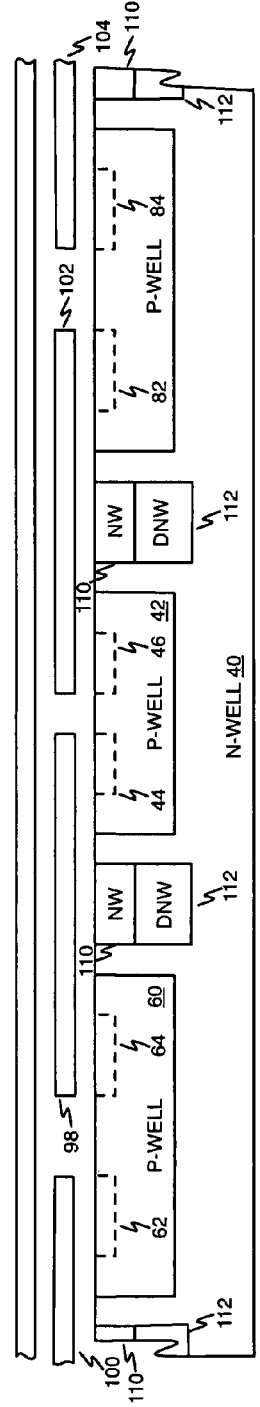
FIGURE 4A
FIGURE 4B

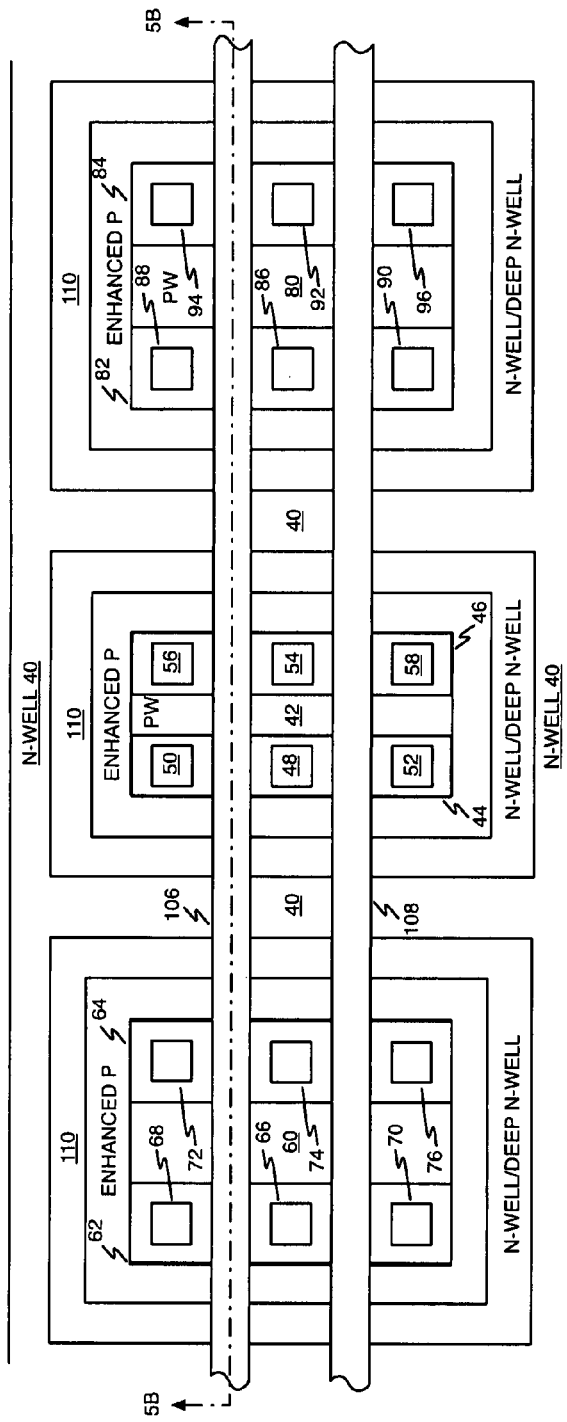
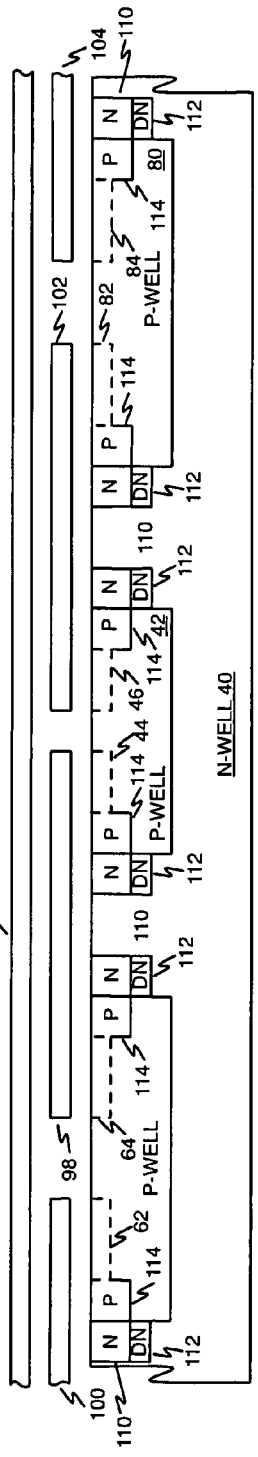
FIGURE 5A
FIGURE 5B

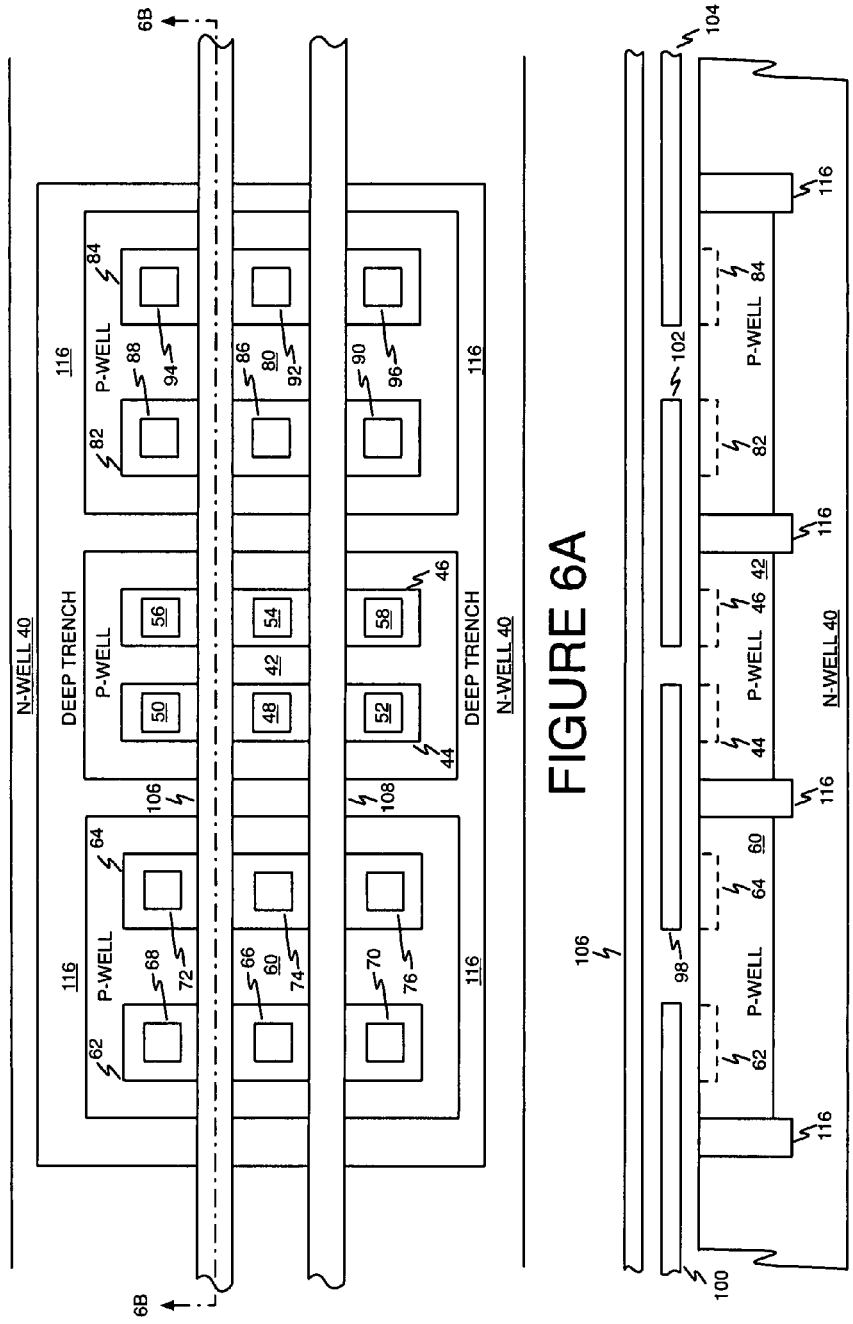

NON-VOLATILE TWO-TRANSISTOR PROGRAMMABLE LOGIC CELL AND ARRAY LAYOUT

RELATED APPLICATIONS

This application is a divisional of U.S. patent application Ser. No. 11/303,865, filed Dec. 16, 2005, which is a continuation-in-part of U.S. patent application Ser. No. 11/155,005, filed Jun. 15, 2005, now issued as U.S. Pat. No. 7,285,818, all of which are hereby incorporated by reference as if set forth herein.

BACKGROUND OF THE INVENTION

1. Field of the Invention

The present invention relates to programmable integrated circuits. More specifically, the present invention relates to layouts for non-volatile memory cells and arrays.

2. The Prior Art

Two-transistor non-volatile memory cells for use in programmable integrated circuits are known in the art. FIGS. 1A and 1B are, respectively, top and cross sectional views of an illustrative group of three pairs of two-transistor non-volatile memory cells. The cross sectional view of FIG. 1B is taken through the dashed line 1B-1B in FIG. 1A.

Each two-transistor non-volatile memory cell (one of which is shown in dashed rectangle 10) of FIG. 1A and is shown formed inside of a p-type well shown at reference numeral 12 formed within an n-type well 14. Each two-transistor non-volatile memory includes a memory transistor and a switch or pass transistor controlled by the memory transistor, disposed within the p-type well. The memory transistor is used to program and erase the cell. The switch transistor may be used, for example, to make interconnections in an FPGA or other programmable logic device. As shown in FIGS. 1A and 1B, the memory transistors are formed from portions of active source/drain regions 16-1, 16-2, and 16-3. These active source/drain regions are shown in solid lines at the right side of each two-transistor non-volatile memory cell in the top view of FIG. 1A and in dashed lines in FIG. 1B as they are out of the plane of the cross section which bisects the channel of the top row of transistors as can be seen by the dashed line 1B-1B in FIG. 1A. Similarly, the switch transistors are formed by portions of active regions 18-1, 18-2, and 18-3, shown in solid lines at the left side of each two-transistor non-volatile memory cell in FIG. 1A and in dashed lines in FIG. 1B.

Persons of ordinary skill in the art will observe that mirrored pairs of memory transistors and switch transistors are shown in p-type well 12 in FIGS. 1A and 1B. Contacts 20-1, 20-2, and 20-3 each form a common source connection for a pair of memory transistors and contacts 22-1, 22-2, and 22-3 each form a common source connection for a pair of switch transistors. Contacts 24-1, 24-2, and 24-3 each connect to the drain of one of the memory transistors in each pair of cells sharing common source connections shown in FIG. 1A. Contacts 26-1, 26-2, and 26-3 each connect to a drain of one of the memory transistors in each pair of cells sharing common source connections shown in FIG. 1A. Contacts 28-1, 28-2, and 28-3 each connect to a drain of one of the switch transistors in each pair of cells and contacts 30-1, 30-2, and 30-3 each connect to a drain of a switch transistor in each pair of cells.

Common control gate 32 is associated with the upper memory and switch transistors of all the pairs of two-transistor non-volatile memory cells shown in FIG. 1A and common control gate 34 is associated with the lower memory and switch transistors of all the pairs of two-transistor non-volatile memory cells. Shown in FIG. 1B, floating gate segments 36-1, 36-2, and 36-3, respectively, are common to the upper memory and switch transistors in each of the three cell pairs shown Floating gate segments 36-1, 36-2, and 36-3 (hidden under control gate 32 and therefore not shown in FIG. 1A) are common to the second memory and switch transistors in the three cell pairs shown in FIGS. 1A and 1B. As will be appreciated by persons of ordinary skill in the art, the floating gate segments are aligned with the control gates with which they are associated.

The programming, erasing, and normal-mode operating of the two-transistor, non-volatile memory cells shown in FIGS. 1A and 1B are all well known to persons of ordinary skill in the art. Briefly, the two-transistor non-volatile memory cell is programmed using the memory transistor. Because the memory transistor and the switch transistor share the same floating gate, the switch transistor is either turned off or turned on depending on the programmed or erased state of the memory transistor.

As can be seen from an examination of FIGS. 1A and 1B the memory transistors are smaller than the switch transistors. As will be appreciated by persons of ordinary skill in the art, this makes the memory transistors easier to program and also allows the switch transistors to have a low on resistance.

While the two-transistor memory cells shown in FIGS. 1A and 1B function satisfactorily for their intended purpose, there remains room for improvement in the technology.

BRIEF DESCRIPTION OF THE INVENTION

A non-volatile memory cell is formed in a semiconductor body. A memory-transistor well is disposed within the semiconductor body. A switch-transistor well is disposed within the semiconductor body and is electrically isolated from the memory-transistor well. A memory transistor through which the cell may be programmed and erased is formed within the memory-transistor well and includes spaced-apart source and drain regions. A switch transistor that may be used to make interconnections between circuit elements is formed within the switch-transistor well region and includes spaced-apart source and drain regions. A floating gate is insulated from and self aligned with the source and drain regions of the memory transistor and the switch transistor. A control gate is disposed above and self aligned with respect to the floating gate and with the source and drain regions of the memory transistor and the switch transistor.

An array of non-volatile memory cells is formed in a semiconductor body. A memory-transistor well is disposed within the semiconductor body. A switch-transistor well is disposed within the semiconductor body and is electrically isolated from the memory-transistor well. A plurality of memory transistors are formed within the memory transistor well, each including spaced-apart source and drain regions. A plurality of switch transistors are formed within the switch-transistor well region, each associated with one of the memory transistors and including spaced-apart source and drain regions. Each memory transistor includes a floating gate insulated from and self-aligned with the source and drain regions of the switch transistor with which it is associated. Each memory transistor also includes a control gate disposed above and self aligned with its floating gate and with the source and drain regions of the at least one switch transistor with which it is associated. More than one switch transistor may be associated with a memory transistor.

According to another aspect of the present invention, because the memory transistors and the switch transistor are disposed in different wells, the characteristics of the memory-transistor wells and transistors, and the characteristics of the switch-transistor wells and transistors can be separately optimized for the different performance characteristics desired for each of these devices.

BRIEF DESCRIPTION OF THE DRAWING FIGURES

FIGS. 1A and 1B are, respectively, top and cross-sectional views of a layout of a group of prior-art two-transistor non-volatile memory cells.

FIGS. 3A and 3B are, respectively, top and cross-sectional views of a layout of a group of two-transistor non-volatile memory cells according to another aspect of the present invention employing common n-type well isolation and n-type well isolation.

FIGS. 4A and 4B are, respectively, top and cross-sectional views of a layout of a group of two-transistor non-volatile memory cells according to another aspect of the present invention employing common n-type well isolation and n-type well isolation with underlying deep n-type well isolation.

FIGS. 5A and 5B are, respectively, top and cross-sectional views of a layout of a group of two-transistor non-volatile memory cells according to another aspect of the present invention employing common n-type well isolation and n-type well isolation with underlying deep n-type well isolation as well as enhanced p-type well isolation.

FIGS. 6A and 6B are, respectively, top and cross-sectional views of a layout of a group of two-transistor memory cells according to another aspect of the present invention employing deep-trench isolation.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons. For example, although exemplary embodiments of the invention are disclosed employing n-channel transistors disposed in p-type bulk regions, p-type transistors disposed in n-type bulk regions may also be employed. In addition, well isolation techniques are disclosed herein, but persons of ordinary skill in the art will appreciate that other isolation techniques, such as silicon on insulator (SOI), may be employed to form the two-transistor non-volatile memory cells and arrays of the present invention.

Figure 2A:
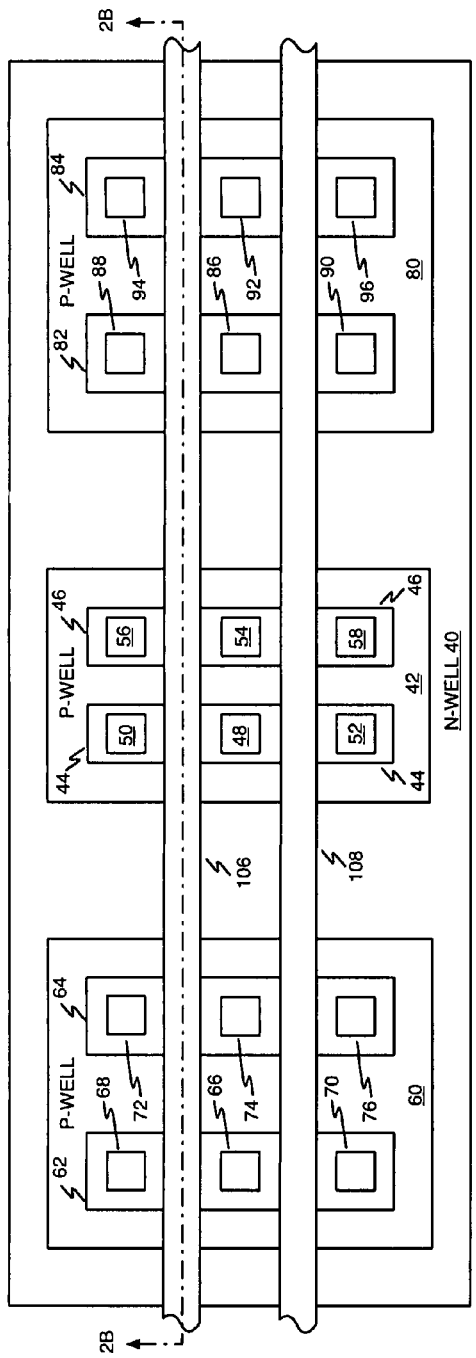
FIGS. 2A and 2B are, respectively, top and cross-sectional views of a layout of a group of two-transistor non-volatile memory cells according to one aspect of the present invention employing common high-voltage n-type well isolation.
Figure 2B:
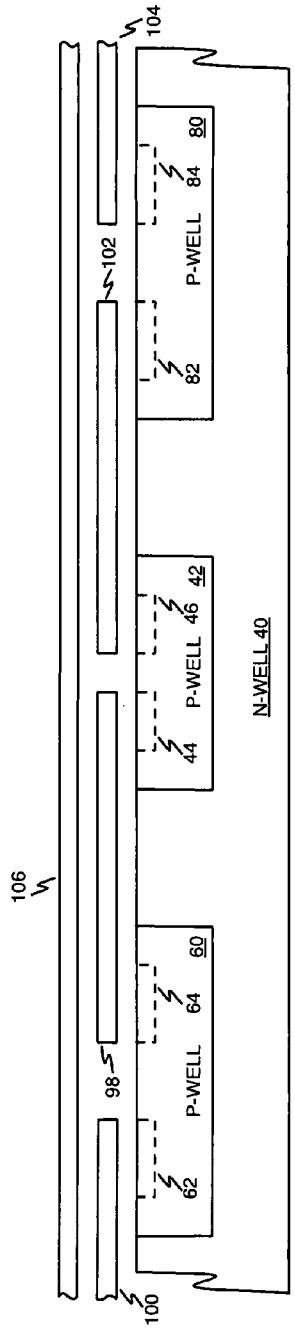

Referring now to FIGS. 2A and 2B, top and cross-sectional views, respectively, are shown of a layout of a group of two-transistor non-volatile memory cells according to one aspect of the present invention employing common high-voltage n-type well isolation. The cross section of FIG. 2B is taken through the dashed line 2B-2B of FIG. 2A.

Unlike the two-transistor non-volatile memory cells of FIGS. 1A and 1B, the transistors of non-volatile memory cells of the present invention are distributed among different p-type wells. Memory transistors and switch transistors are disposed in separate p-wells. As in FIGS. 1A and 1B, the memory cell p-type wells are shown disposed in n-type region 40. N-type region 40 is typically an n-type well disposed in a semiconductor substrate (not shown), although persons of ordinary skill in the art will appreciate that region 40 could be another structure, such as an n-type epitaxial layer formed over a semiconductor substrate as is known in the art. N-type wells may have a depth of between about 0.5 to about 5 microns and doping concentrations between about 1e16 and about 1e18.

A memory-transistor p-type well 42 is disposed in the n-type well 40. P-type well 42 may have a depth between about 0.5 to about 5 microns and may typically be about 30% deeper than the switch p-type wells. P-type wells 42 may be doped to concentrations from between about 1e16 and about 6e17. Active n-type regions 44 and 46 are formed in memory-transistor p-type well 42 and may have doping concentrations between about 1e18 and about 1e19. As will be appreciated by persons of ordinary skill in the art, a mirrored memory-transistor structure is depicted in FIG. 2A, wherein a contact 48 makes contact to a portion of active region 44 that acts as the common source for two separate memory transistors. Contact 50 makes contact to the drain region of a first (upper) one of the memory transistors and contact 52 makes contact to the drain region of a second (lower) one of the memory transistors. Similarly, contact 54 makes contact to a portion of active region 46 that acts as the common source for two separate memory transistors, contact 56 makes contact to a drain region of a first (upper) one of the memory transistors in active region 46 and contact 58 makes contact to the drain region of a second (lower) one of the memory transistors in active region 46. Thus, four separate transistors are shown disposed within memory-transistor p-type well 42.

A first switch-transistor p-type well 60 is disposed in n-type well 40 and is spaced apart from memory-transistor p-type well 42. As with memory-transistor p-type well 42, mirrored switch transistors may be employed in the present invention. Thus, n-type active regions 62 and 64 are formed in switch-transistor p-type well 60. A contact 66 makes contact to a portion of active region 62 that acts the common source for two separate switch transistors. Contact 68 makes contact to the drain region of a first (upper) one of the switch transistors in active region 62 and contact 70 makes contact to the drain region of a second (lower) one of the switch transistors in active region 62. Similarly, contact 72 makes contact to a portion of active region 64 that acts the common source for two separate switch transistors. Contact 74 makes contact to the drain region of a first (upper) one of the memory transistors in active region 64 and contact 76 makes contact to the drain region of a second (lower) one of the memory transistors in active region 64. Thus, four separate transistors are shown disposed within switch-transistor p-type well 60.

A second switch-transistor p-type well 80 is disposed in n-type well 40 and is spaced apart from memory-transistor p-type well 42 on the side opposite from first switch-transistor p-type well 60. As with switch-transistor p-type well 60, mirrored switch transistors may be employed in second switch-transistor p-type well 80. Thus, n-type active regions 82 and 84 are formed in switch-transistor p-type well 80. A contact 86 makes contact to a portion of active region 82 that acts as the common source for two separate switch transistors. Contact 88 makes contact to the drain region of a first (upper) one of the switch transistors in active region 82 and contact 90 makes contact to the drain region of a second (lower) one of the switch transistors in active region 82. Similarly, contact 92 makes contact to a portion of active region 84 that acts as the common source for two separate switch transistors. Contact 94 makes contact to the drain region of a first (upper) one of the memory transistors in active region 84 and contact 96 makes contact to the drain region of a second (lower) one of the memory transistors in active region 84. Thus, four separate transistors are shown disposed within switch-transistor p-type well 80.

Floating gate segment 98 (seen in FIG. 2B) is common to the upper memory transistor formed in active region 44 of memory-transistor p-type well 42 and the upper switch transistor formed in active region 62 of first switch-transistor p-type well 60. A similar floating gate (out of the plane of the cross section of FIG. 2B) is common to the lower memory transistor formed in active region 44 of memory-transistor p-type well 42 and the lower switch transistor formed in active region 62 of first switch-transistor p-type well 60. As will be appreciated by persons of ordinary skill in the art from the description so far, the two switch transistors formed in active region 64 of switch-transistor p-type well 60 are associated with a pair of memory transistors located off of the left-hand side of FIGS. 2A and 2B and thus not shown in the figures. A portion of a floating gate segment 100 is shown that would be used to couple to the upper memory transistor located off of the left-hand side of FIGS. 2A and 2B.

Floating gate segment 102 (seen in FIG. 2B) is common to the upper memory transistor formed in active region 46 of memory-transistor p-type well 42 and the upper switch transistor formed in active region 82 of second switch-transistor p-type well 80. A similar floating gate (out of the plane of the cross section of FIG. 2B) is common to the lower memory transistor formed in active region 46 of memory-transistor p-type well 42 and the lower switch transistor formed in active region 82 of second switch-transistor p-type well 80. As will also be appreciated by persons of ordinary skill in the art from the description so far, the two switch transistors formed in active region 84 of switch-transistor p-type well 80 are associated with a pair of memory transistors located off of of the right-hand side of FIGS. 2A and 2B and thus not shown in the figures. A portion of a floating gate segment 104 is shown that would be used to couple to the upper memory transistor located off of the right-hand side of FIGS. 2A and 2B.

It is apparent that the group of memory cells depicted in FIGS. 2A and 2B may preferably be conveniently configured to be symmetrical about a vertical axis centered between active regions 44 and 46 in memory-transistor p-type well 42 and also about a horizontal axis running through contacts 48, 54, 62, 72, 86, and 92 in memory-transistor p-type well 42 and first and second switch transistor p-type wells 60 and 80. This feature of the present invention facilitates layout of large arrays of two-transistor memory cells for applications such as large-gate-count programmable integrated circuits.

As may be seen from an examination of FIGS. 2A and 2B, control gate 106 is disposed above and aligned with floating gate segments 98, 100, 102, and 104. Control gate 106 is common to all of the upper memory transistors and upper switch transistors in the group depicted in FIGS. 2A and 2B, as well as to memory and switch transistors in other groups disposed within the same horizontal plane as the upper transistors shown in FIGS. 2A and 2B. Similarly, control gate 108 is disposed above and aligned with floating gate segments (not shown) associated with the lower memory and switch transistors in the group that are out of the plane of the cross section of FIG. 2B. Control gate 108 is common to all of the lower memory transistors and lower switch transistors in the group depicted in FIGS. 2A and 2B, as well as to lower memory and switch transistors in other groups disposed within the same horizontal plane as the lower transistors shown in FIGS. 2A and 2B.

As will be appreciated by persons of ordinary skill in the art, the layout of the present invention permits the use of single straight segmented polysilicon lines to form all of the floating gates for the upper (and lower) memory and switch transistors of the group of two-transistor non-volatile memory cells depicted in FIGS. 2A and 2B.

Such skilled persons will observe that the n-type well 40 acts to advantageously provide electrical isolation of the memory transistor in each two-transistor non-volatile memory cell from its switch transistor. This isolation, combined with the grouping of the memory transistors in a memory-transistor well and the switch transistors in a switch-transistor well, not only allows for advantageously programming and erasing of the memory cells, but also advantageously allows the wells, the memory transistors, and the switch transistors to be separately optimized for desired characteristics. For example, the memory-well depth, doping and diffusion parameters and switch-well depth, doping and diffusion parameters can be separately optimized for desired characteristics of the memory transistors (e.g., ease of programming and erase and efficiency) and the switch transistors (e.g., speed, current handling capability). Furthermore, the layout of the present invention will allow a single memory transistor to control multiple switch transistors. For example, in an embodiment where switch p-well 80 contains four active regions, a single memory transistor in active region 46 shares a floating gate with, and therefore controls, two transistors in the switch p-well closest to the memory transistor, while the switch transistors closest to the next memory transistor p-well (located on the opposite side of the switch p-well) will be controlled by that memory transistor.

Referring now to FIGS. 3A and 3B, top and cross-sectional views, respectively, are shown of a layout of a group of two-transistor non-volatile memory cells according to another aspect of the present invention employing common n-type well isolation and other n-type well isolation. The cross section of FIG. 3B is taken through the dashed line 3B-3B of FIG. 3A.

The layout of the group of two-transistor non-volatile memory cells shown in FIGS. 3A and 3B is similar to that depicted in FIGS. 2A and 2B. Elements of the layout of FIGS. 3A and 3B that correspond to elements of the layout depicted in FIGS. 2A and 2B are designated in FIGS. 3A and 3B using the same reference numerals as their counterparts in FIGS. 2A and 2B.

In addition to the isolation provided by the n-type well 40, further isolation is provided by the presence of higher-doped n-type well 110. As shown most clearly in FIG. 3A, higher-doped n-type well 110 surrounds each of the memory-transistor p-type wells 42, and the switch-transistor p-type well regions 60 and 80. As shown in FIGS. 3A and 3B, the outer edges of higher-doped n-type well 110 are preferably spaced apart from the edges of the memory-transistor p-type well region 42 and the switch-transistor p-type well regions 60 and 80. The n-type well regions 110 are referred to as higher-doped n-type wells because they are doped at a concentration higher than that of the surrounding n-type well 40. For example, the higher-doped n-wells may be doped at a concentration that is about an order of magnitude higher than that of the n-type well regions 40.

Referring now to FIGS. 4A and 4B, top and cross-sectional views, respectively, are shown of a layout of a group of two-transistor non-volatile memory cells according to another aspect of the present invention employing common n-type well isolation and other n-type well isolation with underlying deep n-type well isolation. The cross section of FIG. 4B is taken through the dashed line 4B-4B of FIG. 4A.

The layout of the group of two-transistor non-volatile memory cells shown in FIGS. 4A and 4B is similar to that depicted in FIGS. 3A and 3B. Elements of the layout of FIGS. 4A and 4B that correspond to elements of the layout depicted in FIGS. 3A and 3B are designated in FIGS. 4A and 4B using the same reference numerals as their counterparts in FIGS. 3A and 3B.

From an examination of FIG. 4B, it may be seen that a deep n-type well region 112 is formed under higher-doped n-type well region 110. Deep n-type well region 122 may be formed to a depth of between about 0.3 microns and about 3 microns deeper than the p-wells containing the transistors.

Referring now to FIGS. 5A and 5B, top and cross-sectional views, respectively, are shown of a layout of a group of two-transistor non-volatile memory cells according to another aspect of the present invention employing common n-type well isolation and other n-type well isolation with underlying deep n-type well isolation as well as enhanced p-type well isolation. The cross section of FIG. 5B is taken through the dashed line 5B-5B of FIG. 5A.

The layout of the group of two-transistor non-volatile memory cells shown in FIGS. 5A and 5B is similar to that depicted in FIGS. 4A and 4B. Elements of the layout of FIGS. 5A and 5B that correspond to elements of the layout depicted in FIGS. 4A and 4B are designated in FIGS. 5A and 5B using the same reference numerals as their counterparts in FIGS. 4A and 4B.

In addition to the n-type well regions 110 and the deep n-type well regions 112, enhanced p-type regions 114 are disposed about the periphery of the memory-transistor p-type well 42 and the switch-transistor p-type wells 60 and 80. Persons of ordinary skill in the art will also note that, instead of being spaced apart from the edges of the memory-transistor p-type well 42 and the switch-transistor p-type wells 60 and 80, the higher-doped n-type wells 110 and deep n-type wells 112 are preferably located at the edges of the memory-transistor p-type well 42 and the switch-transistor p-type wells 60 and 80 as shown most clearly in FIG. 5B. The enhanced p-type regions 114 are areas of higher p-type dopant concentration. Persons of ordinary skill in the art will appreciate that, by adding the enhanced p-type regions and placing the deep n-type well regions 112 adjacent to the devices, the space-charge regions are significantly reduced. Since the space-charge regions are simply lost area, this geometry allows closer spacing of the devices and thus permits a more closely-spaced layout In the groups of two-transistor non-volatile memory cells presently disclosed, the higher-doped n-type well regions 110 are the most heavily doped. The deep n-type well regions 112 are doped to about 25% of the concentration of the higher-doped n-type well regions 110. The n-type well regions 40 are doped to a concentration that is about an order of magnitude lower than that of the higher-doped n-type well regions 110. The enhanced p-type well regions are doped to a higher than the other p-type well regions to reduce depletion regions.

Referring now to FIGS. 6A and 6B, top and cross-sectional views, respectively, are shown of a layout of a group of two-transistor non-volatile memory cells according to another aspect of the present invention employing deep-trench isolation. The cross section of FIG. 6B is taken through the dashed line 6B-6B of FIG. 6A.

As may be easily seen in both FIGS. 6A and 6B, deep-trench isolation regions 116 are disposed around each of the memory-transistor p-type well 42 and the switch-transistor p-type wells 60 and 80. As will be appreciated by persons of ordinary skill in the art, and as shown most clearly in FIG. 6B, deep-trench isolation regions 116 extend vertically down into n-type well region 42. Deep-trench isolation regions 116 are formed using known technology, and may be filled with silicon oxide or polysilicon, as is known in the art.

In all of the embodiments of the present invention, the memory-transistor p-type well 42 is decoupled from the switch-transistor p-type wells 60 and 80. This allows optimization of the memory-transistor p-type well 42 for program and erase efficiency and optimization of the switch-transistor p-type wells 60 and 80 for device performance. Accordingly, the switch-transistor p-type wells 50 and 80 may be formed as regular low-voltage or I/O device p-type wells. In addition, the switch-transistor source/drain implants, channel lengths and well implants may be optimized for performance characteristics such as low output impedance, and to suppress hot carrier injection programming.

Similarly, the memory-transistor source/drain implants, halo implants, well implants and channel lengths can be optimized for hot carrier injection or Fowler-Nordheim program and erase efficiency and device reliability. Depending on the junction breakdown levels, the switch transistors and the memory transistors can both be placed in low-voltage wells, or the switch transistors can be placed in a low-voltage well and the memory transistors can be placed in a high-voltage well to optimize the spacing between the wells to favorably impact memory cell size.

Figures 7A, 7B:
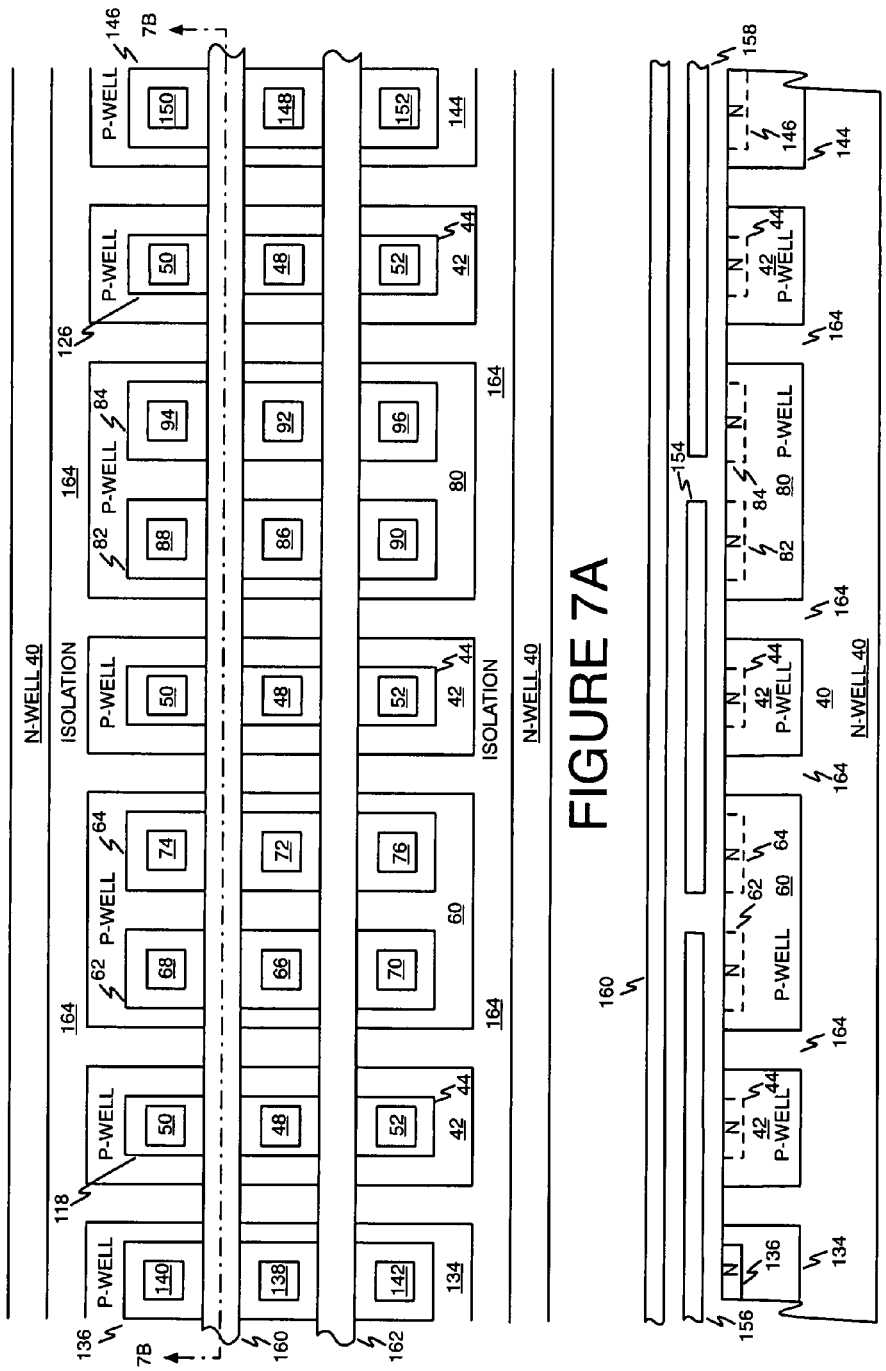
FIGS. 7A and 7B are, respectively, top and cross-sectional views of a layout of a group of memory cells according to another aspect of the present invention wherein a single memory transistor controls two switch transistors.

Referring now to FIGS. 7A and 7B, top and cross-sectional views, respectively, are shown of a layout of a group of non-volatile memory cells according to one aspect of the present invention in which a single memory transistor controls two switch transistors. The cross section of FIG. 7B is taken through the dashed line 7B-7B of FIG. 7A.

As in the two-transistor non-volatile memory cells of FIGS. 2A and 2B through 6A and 6B, the non-volatile memory cells of FIGS. 7A and 7B are distributed among different p-type wells for memory transistors and for switch transistors. As in the other embodiments of the present invention disclosed herein, the memory cell p-type wells are shown disposed in n-type regions 40.

N-type regions 40 are typically an n-type well disposed in a semiconductor substrate (not shown), although persons of ordinary skill in the art will appreciate that region 40 could be another structure, such as an n-type epitaxial layer formed over a semiconductor substrate as is known in the art. N-type wells may have a depth between about 0.5 to about 5 microns and doping concentrations between about 1e16 and about 1e18.

In the embodiment depicted in FIGS. 7A and 7B, three memory-transistor p-type wells 42 are disposed in the n-type well 40. The memory-transistor P-type wells 42 may have depths between about 0.5 to about 5 microns and may typically be about 30% deeper than the switch p-type wells 40. The memory-transistor P-type wells 42 may be doped to a level between about 1e16 and about 6e17. An active n-type region 44 is formed in each of memory-transistor p-type wells 42 and may have doping concentrations ranging from between about 1e18 and about 1e19. As will be appreciated by persons of ordinary skill in the art, a mirrored memory-transistor structure is depicted in FIG. 7A, wherein, in each of p-type wells 42, a contact 48 makes contact to a portion of active region 44 that acts as the common source for two separate memory transistors. Contact 50 makes contact to the drain region of a first (upper) one of the memory transistors and contact 52 makes contact to the drain region of a second (lower) one of the memory transistors. Thus, two separate transistors are shown disposed within each memory-transistor p-type well 42.

A first switch-transistor p-type well 60 is disposed in n-type well 40 to the left of the center one of memory-transistor p-type wells 42 and is spaced apart therefrom. As with memory-transistor p-type wells 42, mirrored switch transistors may be employed in the present invention. Thus, n-type active regions 62 and 64 are formed in switch-transistor p-type well 60. A contact 66 makes contact to a portion of active region 62 that acts the common source for two separate switch transistors. Contact 68 makes contact to the drain region of a first (upper) one of the switch transistors in active region 62 and contact 70 makes contact to the drain region of a second (lower) one of the switch transistors in active region 62. Similarly, contact 72 makes contact to a portion of active region 64 that acts the common source for two separate switch transistors. Contact 74 makes contact to the drain region of a first (upper) one of the memory transistors in active region 64 and contact 76 makes contact to the drain region of a second (lower) one of the memory transistors in active region 64. Thus, four separate transistors are shown disposed within switch-transistor p-type well 60.

A second switch-transistor p-type well 80 is disposed in n-type well 40 to the right of the center one of memory-transistor p-type wells 42 and is spaced apart therefrom. As with switch-transistor p-type well 60, mirrored switch transistors may be employed in second switch-transistor p-type well 80. Thus, active regions 82 and 84 are formed in switch-transistor p-type well 80. A contact 86 makes contact to a portion of active region 82 that acts as the common source for two separate switch transistors. Contact 88 makes contact to the drain region of a first (upper) one of the switch transistors in active region 82 and contact 90 makes contact to the drain region of a second (lower) one of the switch transistors in active region 82. Similarly, contact 92 makes contact to a portion of active region 84 that acts as the common source for two separate switch transistors. Contact 94 makes contact to the drain region of a first (upper) one of the memory transistors in active region 84 and contact 96 makes contact to the drain region of a second (lower) one of the memory transistors in active region 84. Thus, four separate transistors are also shown disposed within switch-transistor p-type well 80.

Similarly, the leftmost one of memory-transistor p-type wells 42 is spaced apart from the first switch-transistor p-type well 60, and contains active region 118, common source contact 120, and upper and lower drain contact regions 122 and 124, respectively. In like manner, the rightmost one of memory-transistor p-type wells 42 is spaced apart from the second switch-transistor p-type well 60, and contains active region 126, common source contact 128, and upper and lower drain contact regions 130 and 132, respectively.

Only the rightmost portion of a third switch-transistor p-type well 134 is shown disposed to the left of and spaced apart from the leftmost one of memory-transistor p-type wells 42, having an active region 136 formed therein. A contact 138 makes contact to a portion of active region 136 that acts as the common source for two separate switch transistors. Contact 140 makes contact to the drain region of a first (upper) one of the switch transistors in active region 136 and contact 142 makes contact to the drain region of a second (lower) one of the transistors in active region 136.

In addition, only the leftmost portion of a fourth switch-transistor p-type well 144 is disposed to the right of and spaced apart from the rightmost one of memory-transistor p-type wells 42 and having active region 146 formed therein. Contact 148 makes contact to a portion of active region 146 that acts as the common source for two separate switch transistors. Contact 150 makes contact to the drain region of a first (upper) one of the memory transistors in active region 146 and contact 152 makes contact to the drain region of a second (lower) one of the memory transistors in active region 146.

Floating gate segment 154 (seen in FIG. 7B) is common to the upper memory transistor formed in active region 44 of the center one of memory-transistor p-type wells 42, the upper switch transistor formed in active region 64 of first switch-transistor p-type well 60, and the upper switch transistor formed in active region 82 of second switch-transistor p-type well 80. A similar floating gate (out of the plane of the cross section of FIG. 7B) is common to the lower memory transistor formed in active region 44 of the center one of memory-transistor p-type wells 42, the lower switch transistor formed in active region 62 of first switch-transistor p-type well 60, and the lower switch transistor formed in active region 82 of second switch-transistor p-type well 80.

Floating gate segment 156 (seen at the left side of FIG. 7B) is common to the upper memory transistor formed in active region 46 of the leftmost memory-transistor p-type well 42, the upper switch transistor formed in active region 62 of first switch-transistor p-type well 60, and the upper switch transistor formed in active region 136 of third switch-transistor p-type well 134. A similar floating gate (out of the plane of the cross section of FIG. 7B) is common to the lower memory transistor formed in active region 46 of the leftmost memory-transistor p-type well 42, and the lower switch transistor formed in active region 136 of third switch-transistor p-type well 134.

Similarly, floating gate segment 158 (seen at the right side of FIG. 7B) is common to the upper memory transistor formed in active region 46 of the rightmost memory-transistor p-type well 42, the upper switch transistor formed in active region 84 of second switch-transistor p-type well 60, and the upper switch transistor formed in active region 146 of fourth switch-transistor p-type well 144. A similar floating gate (out of the plane of the cross section of FIG. 7B) is common to the lower memory transistor formed in active region 46 of the rightmost memory-transistor p-type well 42, and the lower switch transistor formed in active region 146 of third switch-transistor p-type well 144.

As will also be appreciated by persons of ordinary skill in the art from the description so far, the other switch transistors formed in switch-transistor p-type wells 134 and 144 are associated with memory transistors that are respectively located off of the left-hand and right-hand side of FIGS. 7A and 7B and that are thus not shown in the figures. Such skilled persons will also appreciate that the p-type switch transistor wells located at the left and right edges of the array may each have only a single active area for switch transistors formed therein.

It is apparent that the group of memory cells depicted in FIGS. 7A and 7B may preferably be conveniently configured to be symmetrical about a vertical axis centered in the active region in the center one of memory-transistor p-type wells 42 and also about a horizontal axis running through the source contacts 48, 66, 72, 86, 92, 120, 128, 138, and 148 in memory-transistor p-type wells 42 and first through fourth switch transistor p-type wells 60, 80, 134, and 144. This feature of the present invention facilitates layout of large arrays of memory cells for applications such as large-gate-count programmable integrated circuits.

As may be seen from an examination of FIGS. 7A and 7B, control gate 160 is disposed above and aligned with floating gate segments 154, 156, and 158. Control gate 160 is common to all of the upper memory transistors and upper switch transistors in the group depicted in FIGS. 7A and 7B, as well as to memory and switch transistors in other groups disposed within the same horizontal plane as the upper transistors shown in FIGS. 7A and 7B. Similarly, control gate 162 is disposed above and aligned with floating gate segments associated with the lower memory and switch transistors in the group that are out of the plane of the cross section of FIG. 7B. Control gate 162 is common to all of the lower memory transistors and lower switch transistors in the group depicted in FIGS. 7A and 7B, as well as to lower memory and switch transistors in other groups disposed within the same horizontal plane as the lower transistors shown in FIGS. 7A and 7B.

As will be appreciated by persons of ordinary skill in the art, the layout of the present invention permits the use of single straight segmented polysilicon lines to form all of the floating gates for the upper (and lower) memory and switch transistors of the group of non-volatile memory cells depicted in FIGS. 7A and 7B.

Such skilled persons will observe that the various isolation techniques shown in FIGS. 2A and 2b through 6A and 6B may be employed in the non-volatile memory cell array layout shown in FIGS. 7A and 7B. This feature of the embodiment of FIGS. 7A and 7B is shown in FIGS. 8A through 8E, which are cross sections of such memory cells illustrating the various isolation techniques. As may be seen from an examination of FIGS. 8A through 8E, each cross sectional view is taken of a portion of the array of memory cells in FIGS. 7A and 7B extending through the switch p-type wells 60 and 80. From what is shown in FIGS. 8A through 8E, persons of ordinary skill in the art will appreciate how the isolation techniques illustrated therein extend to the remainder of the structures in FIGS. 7A and 7B.

Figure 8A:
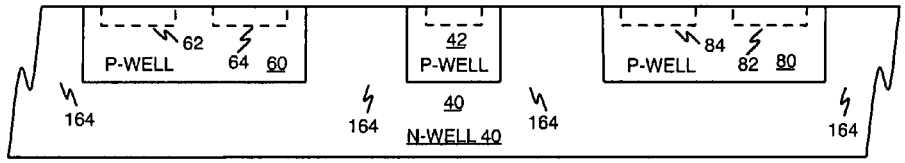
FIGS. 8A through 8E are cross-sectional views of a layout of a group of memory cells such as those in FIGS. 7A and 7B, showing various isolation methods according to the present invention.

Referring now to FIG. 8A, it may be seen that n-type well 40 acts to advantageously provide electrical isolation of the memory transistor in each non-volatile memory cell from its switch transistor. This isolation, shown at reference numerals 164, combined with the grouping of the memory transistors in a memory-transistor well and the switch transistor in a switch-transistor well, not only allows for advantageously programming and erasing of the memory cells, but also advantageously allows the wells, the memory transistors, and the switch transistors to be separately optimized for desired characteristics. For example, the memory-well depth, doping and diffusion parameters and switch-well depth, doping and diffusion parameters can be separately optimized for desired characteristics of the memory transistors (e.g., programming and erase method and efficiency) and the switch transistors (e.g., speed, current handling capability).

Figure 8B:
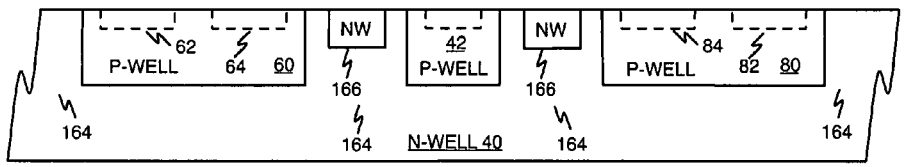

Referring now to FIG. 8B, a layout of a group of non-volatile memory cells according to another aspect of the present invention is shown employing common n-type well isolation and other n-type well isolation. In addition to the isolation provided by the n-type well 40, further isolation is provided by the presence of higher-doped n-type well 166. As shown in FIG. 8B, higher-doped n-type wells 166 disposed in isolation regions 164 surround each of the memory-transistor p-type wells 42 and the switch-transistor p-type well regions 60 and 80. As shown in FIG. 8B, the outer edges of higher-doped n-type well 166 are preferably spaced apart from the edges of the memory-transistor p-type well regions 42 and the switch-transistor p-type well regions 60 and 80. The doping concentration of higher-doped n-type well 166 is higher, and may be, for example, about two times the concentration of the n-well in which it is formed.

Figure 8C:
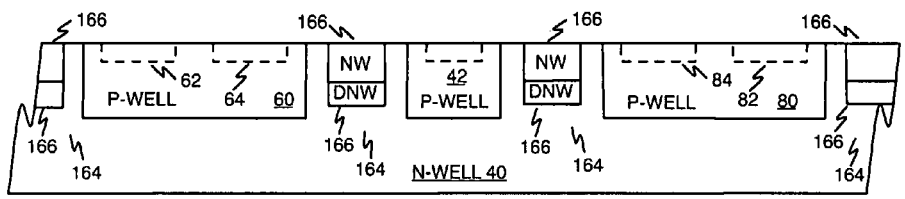

Referring now to FIG. 8C, a cross-sectional view shows a layout of a group of non-volatile memory cells according to another aspect of the present invention employing common n-type well isolation and other n-type well isolation with underlying deep n-type well isolation. The layout of the group of non-volatile memory cells shown in FIG. 8C is similar to that depicted in FIG. 8B. From an examination of FIG. 8B, it may be seen that a deep n-type well region 168 is formed under each n-type well region 166. Deep n-type well region 168 may be formed to a depth sufficient to prevent leakage between adjacent p-wells.

Figure 8D:
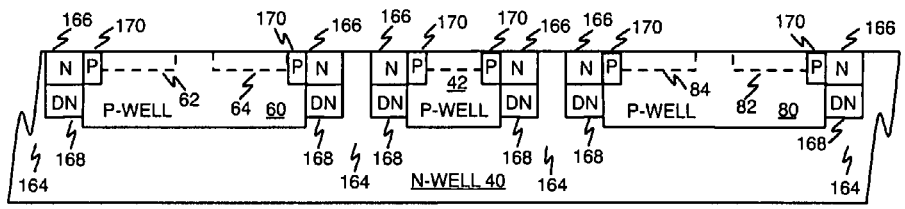

Referring now to FIG. 8D, a cross-sectional view shows a layout of a group of non-volatile memory cells according to another aspect of the present invention employing common n-type well isolation and other n-type well isolation with underlying deep n-type well isolation as well as enhanced p-type well isolation. In addition to the n-type well regions 80 and the deep n-type well regions 168, enhanced p-type regions 170 are disposed about the periphery of the memory-transistor p-type well 42 and the switch-transistor p-type wells 60 and 80. Persons of ordinary skill in the art will also note that, instead of being spaced apart from the edges of the memory-transistor p-type well 42 and the switch-transistor p-type wells 60 and 80, the n-type wells 166 and deep n-type wells 168 are preferably located at the edges of the memory-transistor p-type well 42 and the switch-transistor p-type wells 60 and 80 as shown 6 in FIG. 8C. The enhanced p-type regions 170 are areas of higher p-type dopant concentration than the p-wells that they surround in order to suppress the widths of the space charge regions between the p-well and the adjacent isolation n-well. Persons of ordinary skill in the art will appreciate that, by adding the enhanced p-type regions and placing the deep n-type well regions 168 adjacent to the devices, the space-charge regions are significantly reduced. Since the space-charge regions are simply lost area, this geometry allows closer spacing of the devices and thus permits a more closely-spaced layout.

In the groups of non-volatile memory cells presently disclosed with respect to FIGS. 7A and 7B and 8A through 8D, the n-type well regions are the most heavily doped. The deep n-type well regions 168 are doped to about 25% of the concentration of the n-type well regions 166. The n-type well regions 42 are doped to a concentration that is about an order of magnitude lower than that of the n-type well regions 166. The enhanced p-type well regions are doped to a higher concentration than the other p-type well regions to reduce depletion regions.

Figure 8E:
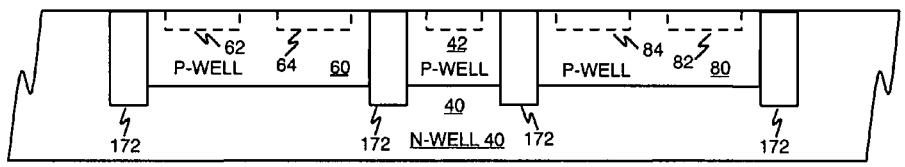

Referring now to FIG. 8E, a cross-sectional view shows a layout of a group of non-volatile memory cells according to another aspect of the present invention employing deep-trench isolation. As may be easily seen in FIG. 8B, deep-trench isolation regions 172 are disposed around each of the memory-transistor p-type well 42 and the switch-transistor p-type wells 60 and 80. As will be appreciated by persons of ordinary skill in the art, and as shown most clearly in FIG. 6B, deep-trench isolation regions 172 extend vertically down into n-type well region 42. Deep-trench isolation regions 172 are formed using known technology.

Figures 9A, 9B:
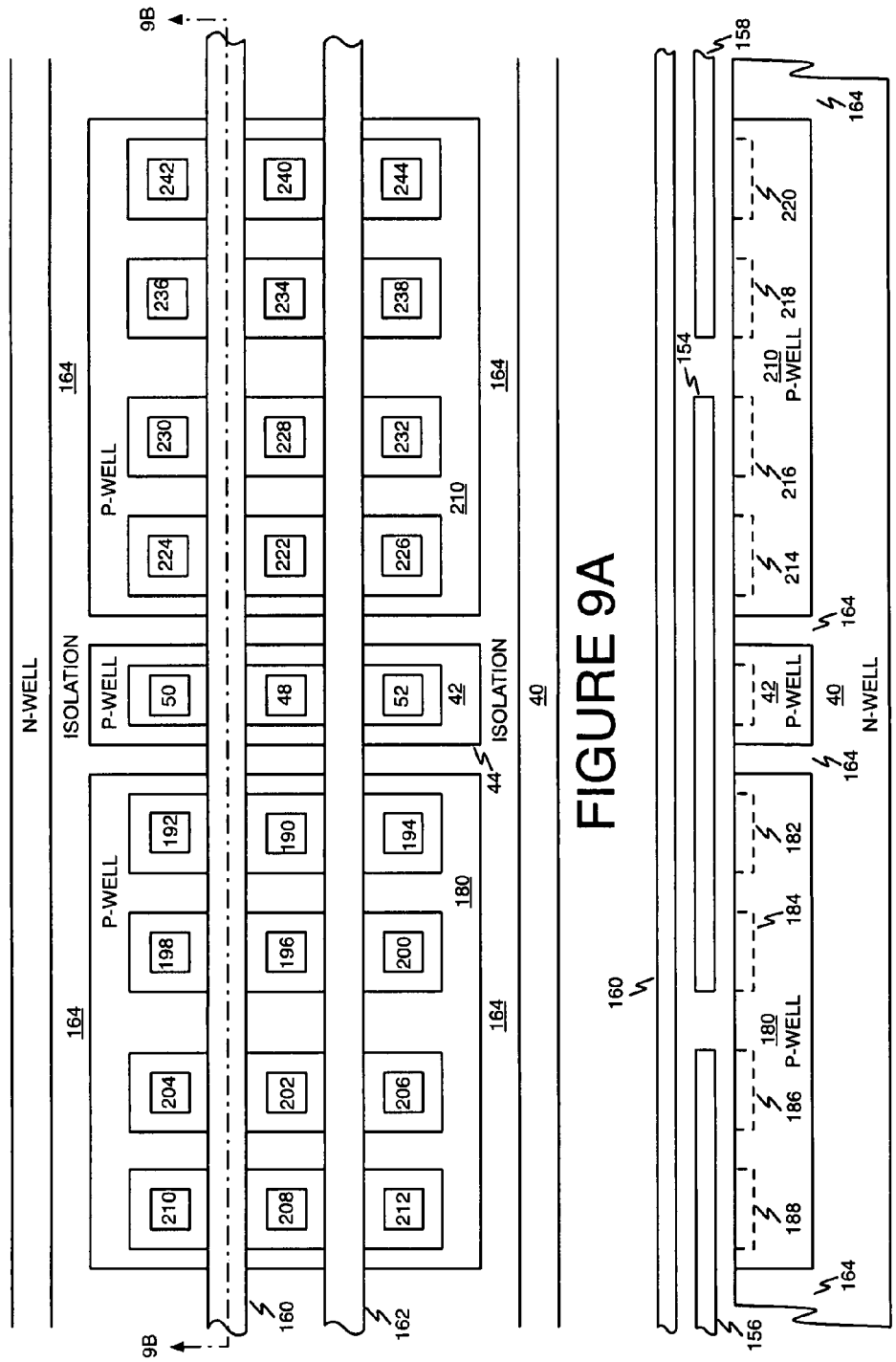
FIGS. 9A and 9B are, respectively, top and cross-sectional views of a layout of a group of memory cells according to another aspect of the present invention wherein a single memory transistor controls four switch transistors.

Referring now to FIGS. 9A and 9B, top and cross-sectional views, respectively, are shown of a layout of a group of non-volatile memory cells according to one aspect of the present invention in which a single memory transistor controls four switch transistors. The cross section of FIG. 9B is taken through the dashed line 9B-9B of FIG. 9A.

The memory cell of FIGS. 9A and 9B is similar to the memory cell of FIGS. 7A and 7B, except that each memory transistor controls four switch transistors, two in the first p-type switch transistor well 170 to the left of memory-transistor p-type well 42 and two in the second p-type switch transistor well 204 to the right of memory-transistor p-type well 42. The layout of the central memory-transistor p-type well 42 is the same as in the earlier embodiments, wherein n-type active region 44 includes a contact 48 for the common sources of upper and lower memory transistors and contacts 50 and 52 for the drain contacts of the upper and lower memory transistors, respectively. P-type well 180 includes four n-type active regions 182, 184, 186, and 188. N-type region 182 includes a contact 190 for the common sources of upper and lower switch transistors and contacts 192 and 194, respectively, for the drain contacts of the upper and lower switch transistors. N-type region 184 includes a contact 190 for the common sources of upper and lower switch transistors and contacts 192 and 194, respectively, for the drain contacts of the upper and lower switch transistors. N-type region 186 includes a contact 196 for the common sources of upper and lower switch transistors and contacts 198 and 200, respectively, for the drain contacts of the upper and lower switch transistors. N-type region 188 includes a contact 202 for the common sources of upper and lower switch transistors and contacts 204 and 206, respectively, for the drain contacts of the upper and lower switch transistors.

Similarly, p-type well 210 includes four n-type active regions 212, 214, 216 and 218. N-type region 212 includes a contact 220 for the common sources of upper and lower switch transistors and contacts 222 and 224, respectively, for the drain contacts of the upper and lower switch transistors. N-type region 214 includes a contact 226 for the common sources of upper and lower switch transistors and contacts 228 and 230, respectively, for the drain contacts of the upper and lower switch transistors. N-type region 216 includes a contact 232 for the common sources of upper and lower switch transistors and contacts 234 and 236, respectively, for the drain contacts of the upper and lower switch transistors. N-type region 218 includes a contact 238 for the common sources of upper and lower switch transistors and contacts 240 and 242, respectively, for the drain contacts of the upper and lower switch transistors.

Floating gate segment 154 (seen in FIG. 9B) is common to the upper memory transistor formed in active region 44 of the memory-transistor p-type well 42, and the upper switch transistors formed in active regions 182 and 184 of first switch-transistor p-type well 180, and the upper switch transistors formed in active regions 221 and 214 of second switch-transistor p-type well 210. A similar floating gate (out of the plane of the cross section of FIG. 9B) is common to the lower memory transistors formed in active region 44 of the memory-transistor p-type well 42, the lower switch transistors formed in active regions 182 and 184 of first switch-transistors p-type well 180, and the lower switch transistors formed in active regions 212 and 214 of second switch-transistor p-type well 210. Thus each memory transistor drives four switching transistors, two in first p-type switch transistor well 180 and two in second p-type switch transistor well 210.

Floating gate segment 156 (seen at the left side of FIG. 9B) is common to the upper switch transistor formed in active region 186 of first switch-transistor p-type well 180, and the upper switch transistor formed in active region 188 of second switch-transistor p-type well 180. A similar floating gate (out of the plane of the cross section of FIG. 9B) is common to the lower switch transistors formed in active regions 186 and 188 of second switch-transistor p-type well 180. The memory transistor that drives these switch transistors is past the left edges of FIGS. 9A and 9B and is not shown.

Similarly, floating gate segment 158 (seen at the right side of FIG. 9B) is common to the upper switch transistor formed in active region 216 of second switch-transistor p-type well 210, and the upper switch transistor formed in active region 218 of second switch-transistor p-type well 210. A similar floating gate (out of the plane of the cross section of FIG. 9B) is common to the lower switch transistors formed in active regions 216 and 218 second switch-transistor p-type well 144. The memory transistor that drives these switch transistors is past the right edges of FIGS. 9A and 9B and is not shown.

In all of the embodiments of the present invention shown herein, the memory-transistor p-type wells are decoupled from the switch-transistor p-type wells. This allows optimization of the memory-transistor p-type wells for program and erase efficiency and optimization of the switch-transistor p-type for device performance. Accordingly, the switch-transistor p-type may be formed as regular low-voltage or I/O device p-type wells. In addition, the switch-transistor source/drain implants, channel lengths and well implants may be optimized for performance characteristics such as low output impedance, and to suppress hot carrier injection programming.

Similarly, the memory-transistor source/drain implants, halo implants, well implants and channel lengths can be optimized for hot carrier injection or Fowler-Nordheim program and erase efficiency and device reliability. Depending on the junction breakdown levels, the switch transistors and the memory transistors can both be placed in low-voltage wells, or the switch transistors can be placed in a low-voltage well and the memory transistors can be placed in a high-voltage well to optimize the spacing between the wells to favorably impact memory cell size.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A non-volatile memory cell including:
   a semiconductor body;
   a memory-transistor well disposed within the semiconductor body;
   a first switch-transistor well disposed within the semiconductor body to a first side of the memory transistor well and electrically isolated from the memory transistor well;
   a second switch-transistor well disposed within the semiconductor body to a second side of the memory transistor well opposite the first side and electrically isolated from the memory transistor well;
   a memory transistor formed within the memory-transistor well and including spaced-apart source and drain regions;
   a first switch transistor formed within the first switch-transistor well region and including spaced-apart source and drain regions;
   a second switch transistor formed within the second switch-transistor well region and including spaced-apart source and drain regions;

a floating gate insulated from and self aligned with the source and drain regions of the memory transistor and the first and second switch transistors; and a control gate disposed above and self aligned with respect to the floating gate and with the source and drain regions of the memory transistor and the first and second switch transistor.

2. The non-volatile memory cell of claim 1, further including:

at least one additional switch transistor disposed in the first switch-transistor well and sharing a floating gate and a control gate with the memory transistor; and at least one additional switch transistor disposed in the second switch-transistor well and sharing a floating gate and a control gate with the memory transistor.

3. The non-volatile memory cell of claim 1 wherein:

the semiconductor body is n-type;

the memory-transistor well and the switch transistor wells are all p-type wells; and the memory transistor and the switch transistors are all n-channel transistors.

4. The non-volatile memory cell of claim 3 wherein the semiconductor body is an n-type well disposed in a p-type semiconductor substrate.

5. The non-volatile memory cell of claim 4, further including:

an enhanced memory-transistor p-type well region disposed about the periphery of the memory-transistor p-type well; and an enhanced switch-transistor p-type well region disposed about the periphery of the switch-transistor p-type wells.

6. The non-volatile memory cell of claim 3 wherein:

the semiconductor body is an n-type well formed in a semiconductor substrate; and the switch-transistor p-type wells are spaced apart from the memory-transistor p-type well and are isolated from the memory transistor p-type well by the n-type well.

7. The non-volatile memory cell of claim 6, further including:

at least one additional switch transistor disposed in the first switch-transistor well and sharing a floating gate and a control gate with the memory transistor; and at least one additional switch transistor disposed in the second switch-transistor well and sharing a floating gate and a control gate with the memory transistor.

8. The non-volatile memory cell of claim 3 wherein:

the semiconductor body is a n-type well formed in a semiconductor substrate; and the switch-transistor p-type wells are spaced apart from the memory-transistor p-type well and are isolated from the memory-transistor p-type well by the n-type well and by a second n-type well formed in the n-type well between the switch-transistor p-type wells and the memory-transistor p-type well.

9. The non-volatile memory cell of claim 8, further including:

at least one additional switch transistor disposed in the first switch-transistor well and sharing a floating gate and a control gate with the memory transistor; and at least one additional switch transistor disposed in the second switch-transistor well and sharing a floating gate and a control gate with the memory transistor.

10. The non-volatile memory cell of claim 8, wherein edges of the second n-type well are spaced apart from edges of the memory-transistor p-type well and the switch-transistor p-type well.

11. The non-volatile memory cell of claim 10, further including a deep n-type well disposed below the second n-type well.

12. The non-volatile memory cell of claim 11, wherein edges of the second n-type well and the deep n-type well are spaced apart from edges of the memory-transistor p-type well and the switch-transistor p-type wells.

13. The non-volatile memory cell of claim 3, wherein the memory-transistor wells are optimized for memory-transistor characteristics and the switch-transistor wells are optimized for switch-transistor characteristics.

14. The non-volatile memory cell of claim 3, wherein the memory-transistor well and the switch-transistor wells are formed to different depths.

15. The non-volatile memory cell of claim 1, wherein the memory-transistor well is electrically isolated from the switch-transistor wells by a deep-trench isolation region.

* * * * *